United States Patent [19]

Scharrer et al.

[11] Patent Number: 5,136,535

[45] Date of Patent: Aug. 4, 1992

[54] HYBRID CMOS-BIPOLAR MEMORY CELL

[75] Inventors: Carl J. Scharrer; Roland H. Pang, both of Plano; Kevin M. Ovens, Garland, all of Tex.

[73] Assignee: Texas Instruments Incorporated, Dallas, Tex.

[21] Appl. No.: 284,801

[22] Filed: Dec. 12, 1988

Related U.S. Application Data

[63] Continuation of Ser. No. 45,982, May 1, 1987, abandoned.

[51] Int. Cl.$^5$ .............................. G11C 7/00
[52] U.S. Cl. .................... 365/156; 365/177
[58] Field of Search ............ 365/156, 177, 190, 154, 365/174

[56] References Cited

U.S. PATENT DOCUMENTS

| | | | |
|---|---|---|---|
| 4,004,284 | 1/1977 | Heeren | 365/154 |
| 4,594,688 | 6/1986 | Uno | 365/154 X |
| 4,701,883 | 10/1987 | Wrathall et al. | 365/154 |
| 4,779,230 | 10/1988 | McLaughlin et al. | 365/156 |

OTHER PUBLICATIONS

A 4 nsec 4Kx1bit Two-Port BiCMOS SRAM by T. S. Yang et al. Center for Integrated Systems, Stanford Univ. May 1988.

Primary Examiner—Joseph A. Popek
Attorney, Agent, or Firm—B. Peter Barndt; Richard L. Donaldson

[57] ABSTRACT

A hybrid CMOS-bipolar memory cell for a high speed memory includes a CMOS latch which has two storage nodes (104) and (106) for storing two logic states. The CMOS latch is disposed between a high voltage node (110) and a low voltage node (114). The two nodes are maintained at a predetermined voltage to maintain a static state. A bipolar current drive transistor (120) is provided which is connected to one of the storage nodes (106) to provide a low source impedance for output from the memory cell. A work line (44) is connected to the high voltage node (110) for selection thereof by varying between two predetermined voltages. The cell is written to be selectively discharging either node (104) or (106) to a low voltage node (114) through bipolar transistors (122) and (124). The bipolar transistor (122) and (124) provide high transconductance switches for selectively discharging the storage nodes (104) and (106).

27 Claims, 2 Drawing Sheets

HYBRID CMOS-BIPOLAR MEMORY CELL

This application is a continuation of application Ser. No. 045,982, filed May 1, 1987, now abandoned.

TECHNICAL FIELD OF THE INVENTION

The present invention pertains in general to memory cells for static random access memories and, more particularly, to a high speed bipolar memory utilizing a low current CMOS latch for the memory cell.

BACKGROUND OF THE INVENTION

High speed memories have conventionally utilized bipolar technology due to the low source impedance of bipolar transistors as opposed to use of MOS transistors which provide a nonlinear resistance for driving various nodes and output lines. Pure MOS memories are relatively slow with respect to access time as compared to bipolar memories. This is due to the fact that high density memories have a large number of transistors which are interconnected by long lengths of line which have a relatively high capacitance associated therewith. However, MOS memories have a significant advantage over bipolar memories in that they draw very low current.

In order to improve the access time of an MOS memory, bipolar devices have been combined with MOS devices to provide a low source impedance to drive various output or high capacitance nodes. However, when combining bipolar and CMOS transistors on the same integrated circuit, it is necessary that the voltages that control the various transistors be compatible. For example, bipolar transistors utilizing emitter coupled logic (ECL) require a very small voltage swing whereas MOS devices require rather large voltage swings to insure proper operating characteristics.

Generally, specifications for high speed memories require compatability with ECL levels. Therefore, when MOS technology is incorporated into a high speed bipolar device, translation circuits are utilized to interface between the ECL circuitry and the MOS circuitry. For example, in an ECL memory, the input and output of all the address lines to the package would require ECL compatibility. When an MOS memory cell which would provide low current is utilized, translation circuits internal to the package are required to convert the ECL voltage swings to the much higher voltage swing required for MOS circuitry. This can be a disadvantage due to the larger amount of circuitry required to perform the translation, which circuitry would inherently have a predetermined amount of delay and also consume additional current.

Since the purpose of incorporating MOS transistors into a high speed memory is to minimize power consumption, the use of translation circuits would detract somewhat from the realized advantages. A further disadvantage exists in the size of the MOS memory cells which are usually rather large due to the requirement that the MOS transistors must drive large capacitive loads. In order to provide the appropriate drive at a reasonable operating speed, the size of the MOS transistors is increased to lower the series resistance or source impedance of that transistor. This results in an overly large cell which, in addition to the additional circuitry required for the translation, requires a proportionally large amount of silicon area to realize a practical memory cell with MOS transistors.

BRIEF DESCRIPTION OF THE DRAWINGS

For a more complete understanding of the present invention and the advantages thereof, reference is now made to the following description taken in conjunction with the accompanying Drawings in which.

SUMMARY OF THE INVENTION

The present invention disclosed and claimed herein comprises a high speed memory cell. The memory cell includes a low current CMOS latch for storing first and second logic states internal thereto and having first and second storage nodes. The latch has a cell select input terminal for being disposed at a first cell select level or a second nonselect level that is lower than the cell select level. A reference terminal is provided for being disposed at a reference voltage. The first and second storage nodes are disposed at opposite voltages at either the voltage level of the cell select terminal or the voltage level of the reference terminal. A low source impedance current driving circuit is provided for sourcing current from a supply to an external load in response to the sensed one of the storage nodes being at a voltage higher than the nonselect voltage level and not sourcing current when the sensed storage node voltage is below that level. The logic state of the latch is alterable by discharging a select one of the first and second storage nodes in response to receiving external write data and a write enable signal for a selected cell, such that the opposite storage node is forced to the level of a cell select terminal.

In another embodiment of the present invention, the driving circuit comprises a bipolar transistor which sources current from the cell select terminal to the external load. The base of the bipolar transistor is connected to one of the storage nodes. The emitter base junction of the bipolar transistor is forward biased when the base voltage thereof is disposed at the cell select level.

In another embodiment of the present invention, a bipolar transistor is disposed between each of the storage nodes and the reference voltage terminal with the base thereof connected to an inverted and a noninverted write data signal. The discharge transistors are operable to discharge the voltage in the storage nodes when the write data signal is at a voltage above a predetermined threshold with respect to the reference voltage terminals. An external write select signal provides the voltage to the reference voltage terminal which is varied between a first level less than the maximum level in the write data signal by the predetermined threshold, and a second level that is equal to the maximum level in the write data signal for a nonwrite select mode.

A technical advantage is provided by the present invention by utilizing a low current CMOS latch in a bipolar memory with a low source impedance driver circuit for interfacing the stored voltage in the latch to an output load. A single cell select line is operable to provide a read function by varying the upper voltage supply on the latch between two levels to activate the driver circuit only on one level. A further technical advantage is provided by selectively discharging one of the storage nodes in the CMOS latch to write data into the cell. The cell is selected for writing by the presence of both a cell select signal and a write enable signal which varies the voltage level to which the storage nodes are discharged. This provides a write select function that writes data to the cell when the voltage on the reference terminal is below the maximum level of the write data and a nonselect mode when the reference voltage is at the maximum level of the data. A further technical advantage is provided in that a simultaneous read and write operation is provided when the cell is selected and a write enable signal for the selected cell is present.

DETAILED DESCRIPTION OF THE INVENTION

Figure 1:
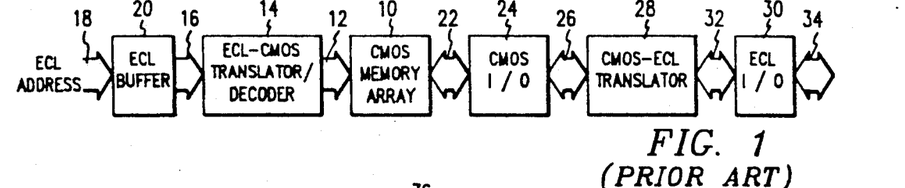
FIG. 1 illustrates a schematic block diagram of a prior art BICMOS memory array.

Referring now to FIG. 1, there is illustrated a schematic block diagram of a prior art high speed memory utilizing emitter coupled logic (ECL) technology for the input and output circuitry and CMOS technology for storage of data. The memory of FIG. 1 utilizes a CMOS memory array 10 that receives a CMOS compatible address from an address bus 12. The address is output by an ECL to CMOS translator 14. The translator 14 receives at the input thereof ECL compatible voltages from a bus 16 that are converted to CMOS compatible voltage swings on bus 12. The signals on bus 16 are received from an input address line 18 which is buffered by an ECL buffer 20.

The CMOS memory array 10 interfaces an Input/Output (I/O) bus 22 with a CMOS I/O circuit 24. The CMOS I/O circuit 24 in turn interfaces through the bus 26 with a CMOS to ECL translator 28 which is operable to translate voltage levels from CMOS to ECL for data that is being read from the memory array 10 and also to translate signals from ECL to CMOS that are being written to the memory array 10. The translator 28 interfaces with an ECL I/O circuit 30 through a bus 32. The ECL I/O circuit 30 interfaces with the data input/output port of the device through bus 34.

The prior art system utilizing CMOS memory array 10 has significant disadvantages due to the speed of operation. First of all, the memory array 10 operates at the speed of a CMOS device with additional time delays incurred in the translators 14 and 28. The ECL circuitry by comparison operates at high speed and also provides the capability of interfacing with ECL compatible input/output signals and data and row and column address signals. This is necessitated since conventional high speed memories are normally specified for use with bipolar compatible signals.

Figure 2:
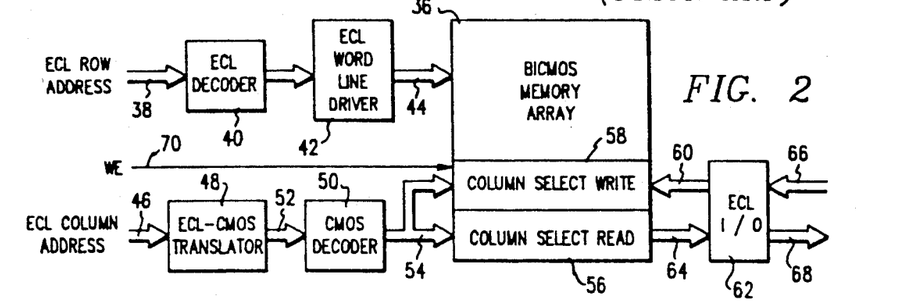
FIG. 2 illustrates a schematic block diagram of a memory utilizing the memory cell of the present invention.

Referring now to FIG. 2 there is illustrated a schematic block diagram of the memory of the present invention utilizing a hybird memory cell in a BICMOS memory array 36. The BICMOS memory array 36 is operable to receive access signals or word line signals which are ECL compatible and to output ECL compatible output signals. The access time therefore approaches that of an ECL static memory. However, the memory cells of the array 36, as will be described hereinbelow, utilize CMOS latches which consume virtually no current in the static state.

The memory array 36 is comprised of a plurality of rows and columns of memory cells with rows being selected by a row address which is received on an input row address bus 38. The row address is decoded in an ECL decoder 40 which drives a word line driver 42 for output of a single word line to each row of memory cells in the array 36 on word lines 44. Only one word line is selected for any given row address on row address bus 38. A column in the array 36 is selected by a column address bus 46 which receives ECL compatible address signals. The column address on bus 46 is input to an ECL to CMOS translator 48 for conversion of the voltages on address lines in address bus 46 to CMOS compatible voltage swings. The output of translator 48 is input to a CMOS decoder 50 on a bus 52 for output on column select lines 54, one column select line being activated for a given column address on bus 46. The column select lines 54 are input to a column select read circuit 56 and a column select write circuit 58. The column select write circuit 58 is operable to receive input data on a bus 60 from an ECL I/O circuit 62. The column read circuit 56 is operable to transfer accessed data from the memory array 36 to the ECL I/O circuit 62 on a bus 64. The ECL I/O circuit 62 is interfaced to the exterior of the memory through a data input bus 66 and a data output bus 68. The column select with circuit 58 also requires a write enable signal (WE), as will be described hereinbelow which is received on line 69.

Figure 3:
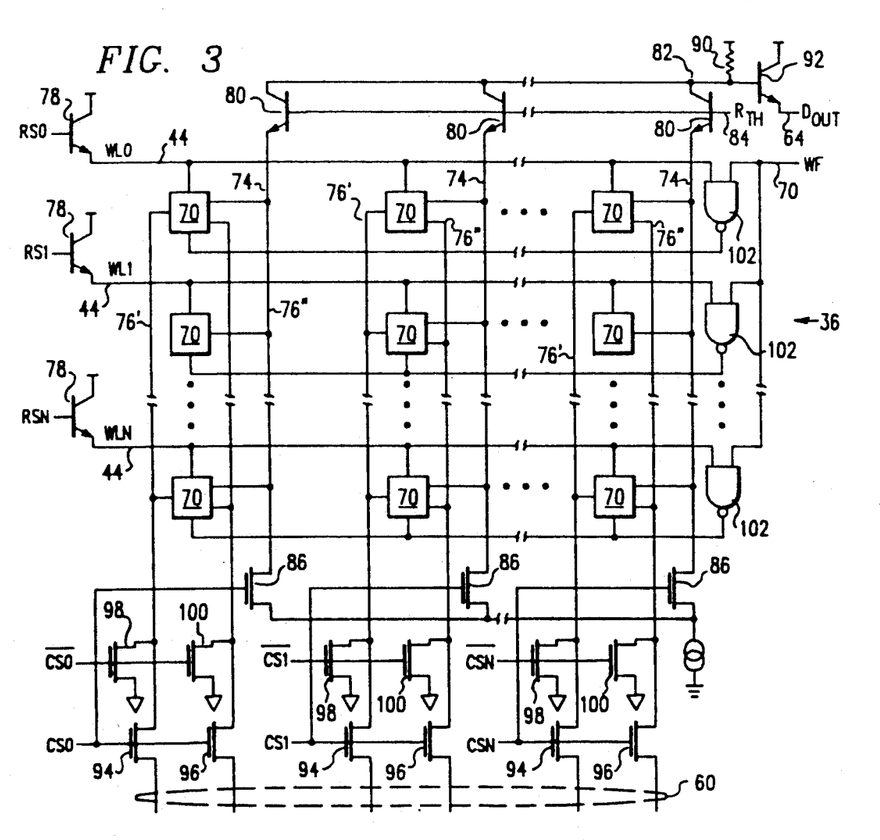
FIG. 3 illustrates a schematic diagram of the memory array.

Referring now to FIG. 3 there is illustrated a schematic diagram of the memory array 36, column select write circuit 58 and the column select read circuit 56 of FIG. 2. The memory array 36 is comprised of memory elements 70 which are arranged in rows and columns. There are N rows and N columns with row select lines are RS0-RSN and column select lines CS0-CSN. For simplicity purposes, only rows corresponding to row select lines RS0, RS1 and RSN are illustrated and columns corresponding to column select lines CS0, CS1 and CSN are illustrated.

Each of the memory elements 70 is associated with one row and one column. Memory cells 70 are each connected to one of the word lines 44 on a word select input, to a read column line 74 for the associated column and to two write data column lines 76' and 76". Each of the word lines 44 is connected to the emitter of a driver transistor 78, the collector of which is connected to the supply voltage $V_{CC}$ and the base of which is connected to one of the row select signals RS0-RSN. The column data output line for each column is connected to the emitter of a threshold transistor 80, the collector of which is connected to a node 82 and the base of which is connected to a threshold terminal 84, which threshold terminal 84 is connected to a threshold reference voltage $R_{th}$. Each of the transistors 80 in the columns of array 36 have the base thereof connected to threshold terminal 84 and the collector thereof connected to node 82. Each of the column output lines 74 are also connected through an MOS gate transistor 86 to a current source 88 which is connected on one side to $V_{EE}$. Node 82 is connected through a resistor 90 to $V_{CC}$ and also to the base of an output drive transistor 92. The collector of drive transistor 92 is connected to $V_{CC}$ and the emitter thereof is connected to the output bus 64. Each of the MOS transistors 86 has the gate thereof connected to an associated one of the column select lines CS0-CSN. Transistors 80, transistors 92 and MOS transistors 86 operate to perform the column select function of circuit 56 in FIG. 2.

In operation, memory cells 70 are Wired ORed to the column output line 74. When the cells 70 on a particular column are not accessed, current is being conducted through only one of the MOS transistors 86 corresponding to the select column. For the selected column, current is either being conducted through the threshold transistor 80 to the current source 88 or being sourced from the selected memory cell 70. When current is conducted by transistor 80, the voltage of node 82 will be at the threshold voltage of $R_{TH}$ minus the emitter-base diode drop of threshold transistor 80. When current is sourced from one of the memory cells 70 node 82 will be at $V_{CC}$ rendering the threshold transistor 80 nonconductive. Therefore, for the selected column and row and the associated memory cell 70, the output data on the data output bus 64 will depend on whether current is being sourced to current source 88 from memory cell 70 or through threshold transistors 80.

The column select write circuit 58 is comprised of the column write data lines 76' and 76" which are each connected through MOS transistors 94 and 96, respectively, to data input bus 60. The gates of transistors 94 and 96 are each connected to the respective one of the column select lines CS0-CSN. When a column is selected, both write data lines 76' and 76" associated with the selected memory cell are connected to $V_{EE}$ through transistors 98 and 100, respectively. The gates of MOS transistors 98 and 100 are each connected to the inverted form of column select lines CS0-CSN. Each of the memory cells 70 also has a Write Select input which is connected to the output of an AND logic gate 102, one input of which is connected to the respective word line 44 and the other input of which is connected to the Write Enable signal on line 69. Selection of a memory cell 70 in addition to the presence of a Write Enable signal allows data on bus 62 to change the logic state stored in the selected memory cell 70.

Figure 4:
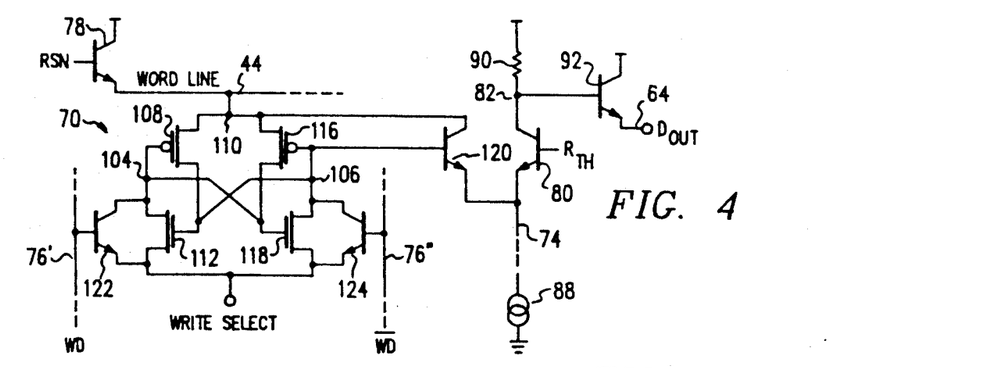
FIG. 4 illustrates a schematic diagram of the memory cell.

Referring now to FIG. 4, there is illustrated a detailed schematic diagram of the memory cell 70. The memory cell 70 is comprised of a cross coupled CMOS latch which has cross coupled storage nodes 104 and 106. Storage node 104 is connected to the gate of a P-channel MOS transistor 108, the source of which is connected to a positive voltage node 110 and the drain of which is connected to storage node 106. Storage node 104 is also connected to the source of an N-channel transistor 112, the drain of which is connected to a low voltage node 114 and the gate of which is connected to storage node 106. In a similar manner, storage node 106 is connected to the gate of a P-channel transistor 116, the source of which is connected to high voltage node 110 and the drain of which is connected to storage node 104. Storage node 106 is also connected to the source of an N-channel transistor 118, the drain of which is connected to low voltage node 114 and the gate of which is connected to storage node 104. Storage node 106 comprises the output node and is connected to the base of a bipolar NPN transistor 120, the collector of which is connected to high voltage node 110 and the emitter of which provides the output connection to column output line 74.

In operation, one of the storage nodes 104 and 106 will be at a high voltage level relative to the other to provide a "latched" state. Once the latched state is established, it is only necessary to maintain high voltage node 110 at a predetermined voltage higher than low voltage node 114. Typically, this will require a voltage difference that is greater than three threshold voltages ($V_T$) of the MOS transistors such that the gate of any of the transistors 108, 112, 116 and 118 have this voltage available to enable the device to turn on.

In order to read a voltage stored on node 106 from the cell, it is necessary for the voltage on node 106 to either be higher than the threshold voltage $R_{TH}$ on threshold transistor 80 or lower, depending upon the logic state. Therefore, current is either conducted through transistor 80 or transistor 120. When the cell 70 is nonselected, transistor 120 is maintained off by maintaining the voltage on node 106 below that of the threshold voltage $R_{TH}$ on threshold transistor 80. When the cell 70 is selected, transistor 120 is turned on for a high voltage on node 106 that is greater than $R_{TH}$ to source current from word line 44 through transistor 120 to current source 88. The voltage on either node 104 or node 106 will be equal to the voltage on high voltage node 110 in one logic state and the voltage on low voltage node 114 in the opposite logic state. In the nonselected state, it is necessary that the maximum voltage on node 110 is always below the threshold of voltage $R_{TH}$. In the selected node, the maximum voltage on node 110 is above the voltage on $R_{TH}$ such that a high voltage on node 106 will enable transistor 120 to conduct current to current source 88. In the preferred embodiment, node 110 in the nonselected state is disposed at a voltage of $V_{CC}-2V_D$ where $V_D$ is the emitter base forward biased diode voltage. In the selected state, the voltage is disposed at a voltage level of $V_{CC}$. Therefore, the threshold voltage $R_{TH}$ is disposed at a level between $V_{CC}-V_D$ and $V_{CC}-2V_D$.

Selection of the memory cell 70 is controlled by the voltage on word line 44 which is driven in the selected state by transistor 78. This provides a read function for accessing data stored in the memory cell with a low impedance source drive provided by transistor 120. Node 106 controls transistor 120 and is a capacitive node in the memory cell which is charged up by either transistor 108 or discharged by transistor 118. In a conventional MOS array, node 106 is required to drive a capacitive bit line. In order to perform this function, it would be necessary to utilize a rather large transistor 118 or transistor 108 to provide a relatively low series resistance to the capacitive bit line in addition to providing a sufficient voltage swing compatable with CMOS technology. By utilizing the bipolar transistor 120, smaller devices can be utilized for MOS transistors 108, 112, 116 and 118, since they only drive the base of transistor 120 with transistor 120 providing a very low source impedance to line 74. This allows the memory cell 70 to drive a higher capacitance load while utilizing smaller MOS transistors, thus resulting in a smaller overall cell. By utilizing MOS technology for the storage latch, low current operation is realized in the static state with the integrated bipolar transistor 120 in the memory cell 70 providing the low source impedance drive capabilities.

In order to change the logic state of the memory cell 70, a bipolar NPN transistor 122 is connected across the source-drain path of MOS transistor 112 with the emitter thereof connected to node 114 and collector or thereof connected to node 104. The base of transistor 122 is connected to the Write Data line 76'. In a similar manner, a bipolar NPN transistor 124 is connected across the source-drain path of MOS transistor 118 with the emitter thereof connected to low voltage node 114 and the collector thereof connected to storage node 106. The base of transistor 124 is connected to the Write Data line 76".

In operation, transistors 122 and 124 are operable to selectively connect either node 104 or node 106 to low voltage line 114. This occurs only if the voltage on node 114 is at least one $V_D$ below the voltage on the Write Data lines 76' and 76". In order to facilitate this, the voltage on low voltage node 114 for the nonwrite mode is normally disposed at $V_{EE}+V_D$. For the write select operation, the voltage on node 114 is disposed at a voltage $V_{EE}$. In a similar manner, the write data signal varies between a voltage of $V_{EE}$ and a voltage of $V_{EE}+V_D$. When the voltage on Write Data lines 76' or 76" is at $V_{EE}+V_D$ and the voltage on node 114 is at $V_{EE}$, the respective transistor 122 or 124 will conduct and discharge the respective node 104 or 106. By utilizing a bipolar transistor with a low source impedance for this discharge function, the respective node can be discharged in a relatively short time. However, in the alternative, an MOS transistor could be utilized in place of transistors 122 and 124. This would be an N-channel MOS transistor and it would only be necessary to vary the write select voltage between $V_{EE}+V_T$ and $V_{EE}$ and the write data voltage from $V_{EE}$ to $V_{EE}+V_T$ where $V_T$ is the threshold voltage of an N-channel MOS transistor.

Figure 5:
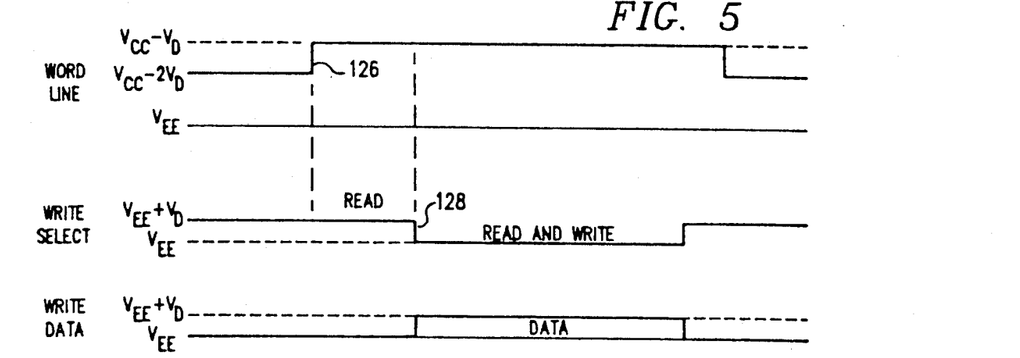
FIG. 5 illustrates a timing diagram for the read and write operation.

Referring now to FIG. 5, there are illustrated a timing diagrams for the word line, Write Select and Write Data signals illustrating the read and write operations. Initially, the word line is disposed at a voltage of $V_{CC}-2V_D$. In this state, the Write Select signal on node 114 can either be at $V_{EE}$ or $V_{EE}+V_D$. Since, as described above with respect to FIG. 3, the voltage on the column Write Data lines 76' and 76" is held at $V_{EE}$ by transistors 98 and 100, transistors 122 and 124 will not be turned on to alter the logic state on nodes 104 and 106. It is only necessary that the difference between the voltage $V_{CC}-V_D$ on high voltage node 110 and the maximum voltage $V_{EE}+V_D$ on the low voltage node 114 differ by approximately three $V_T$s to maintain the stored logic states on nodes 104 and 106.

The cell 70 is selected by raising the voltage on word line 44 from a level of $V_{CC}-2V_D$ to a level of $V_{CC}-V_D$. This is noted by an edge 126 on the word line signal. When the word line 44 is high, the memory cell 70 is operable to be read such that a high voltage level on node 106 results in transistor 122 conducting. If it is desired to write information into the cell, the voltage of node 114 makes a transition from a voltage level of $V_{EE}+V_D$ to $V_{EE}$. This allows a data voltage of $V_{EE}+V_D$ on the Write Data lines 76' and 76" to turn on the respective one of the bipolar NPN transistors 122 or 124, thus discharging the respective nodes 104 or 106. For example, if transistor 112 is turned on discharging node 104, this will turn on P-channel transistor 108 which connects the voltage on node 110 to node 106, thus turning off P-channel transistor 116. This latches a low voltage onto node 104 and a high voltage onto node 106. This operation is initiated at a clock edge 128 on the Write Select input signal. The data on Write Data lines 76' and 76" can be present at any time with no effect on the logic state of memory cell 70 until the Write Select signal 114 goes to $V_{EE}$. It is important to note that the collector of transistor 120 is connected to high voltage node 110. For the selected state and with a high voltage on node 106, node 110 is connected through P-channel transistor 108 to node 106. Therefore, any change in the voltage on node 106 in a high voltage state will be reflected on the collector of transistor 120. This prevents transistor 120 from turning off due to other clock signals in the system affecting levels on node 106 due to bootstrapping of voltages through to node 106.

Figure 6:
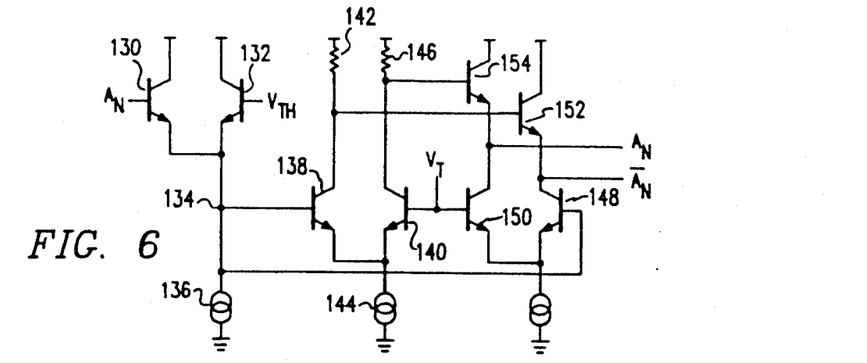
FIG. 6 illustrates a schematic diagram of an ECL buffer.

Referring now to FIG. 6, there is illustrated a schematic diagram of an input ECL buffer for receiving one of the address lines $A_N$ for the row or the column address. The address signal $A_N$ is input to one input of an ECL gate which is comprised of two NPN bipolar transistors 130 and 132 with the base of transistor 130 connected to the signal line $A_N$ and the base of transistor 132 connected to a threshold voltage $V_{TH}$. The collectors of transistors 130 and 132 are connected to $V_{CC}$ and the emitters thereof are connected to a node 134. Node 134 is connected to a current source 136 to provide current for the input gate.

Node 134 is input to a second ECL gate which is comprised of two NPN transistors 138 and 140, the base of transistor 138 connected to node 134 and the base of transistor 140 connected to a threshold voltage $V_T$. The collector of transistor 138 is connected to $V_{CC}$ through a resistor 142 and the base thereof connected to a current source 144. Transistor 140 has the collector thereof connected to $V_{CC}$ through a resistor 146 and the emitter thereof connected to current source 144.

Node 134 is also connected to a third ECL gate which is comprised of two NPN transistors 148 and 150, the base of transistor 148 connected to node 134 and the base of transistor 150 connected to threshold voltage $V_T$. The collector of transistor 148 is connected through the emitter-collector path of an NPN transistor 152 to $V_{CC}$, and the collector of transistor 150 is connected through the emitter-collector path of an NPN transistor 154 to $V_{CC}$. Transistor 152 has the base thereof connected to the collector of transistor 138 and the transistor 154 has the base thereof connected to the collector of transistor 140. The collector of transistor 150 comprises the noninverted address signal $A_N$ and the collector transistor 148 comprises the inverted form of the address signal $A_N$.

Figure 7:
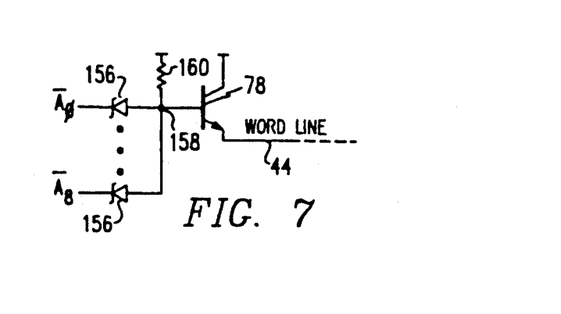
FIG. 7 illustrates a schematic diagram of an ECL decoder.

Referring now to FIG. 7, there is illustrated a schematic diagram of an ECL decoder. The ECL decoder is connected to the output of the buffer in FIG. 6 and is comprised of a series of diodes 156 which each have the anode thereof connected to a node 158 and the cathode thereof connected one of the respective outputs of the buffer of FIG. 6. When each of the address Signals $A_0$-$A_N$ or the inverted forms thereof are high, node 158 will be high. However, if any of them are low, node 158 will be low. Node 158 is connected to $V_{CC}$ through a resistor 160. Node 158 is also connected to the base of the word line driver transistor 78. When node 158 is high, transistor 78 will conduct and raise the word line 44 to a voltage of $V_{CC}-V_D$.

Figure 8:
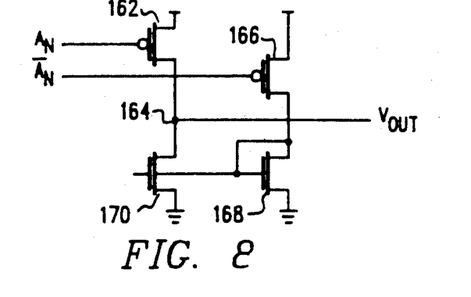
FIG. 8 illustrates a schematic diagram of a translation circuit for converting ECL voltage swings to CMOS voltage swings.

Referring now to FIG. 8 there is illustrated a schematic diagram of an ECL to CMOS translator which is connected to the output of the buffer of FIG. 6. This is utilized to convert the buffered ECL signals to CMOS voltage swings. The noninverted input signal $A_N$ is connected to the gate of a P-channel transistor 162, the source of which is connected to $V_{CC}$ and the drain of which is connected to a node 164. The inverted address signal $A_N$ is input to the gate of a second P-channel transistor 166, the source of which is connected to $V_{CC}$ and the drain of which is connected to the source of an N-channel transistor 168. N-channel transistor 168 has the gate thereof connected to the source thereof and the drain connected to $V_{EE}$. The gate of N-channel transistor 168 is also connected to the gate of an N-channel transistor 170, the source of which is connected to node 164 and the drain of which is connected to $V_{EE}$. Node 164 comprises the output terminal. In operation, the high voltage for $A_N$ will turn off P-channel transistor 162 with transistor 166 being turned on. This will raise the voltage on the gates of both transistors 168 and 170, thus turning transistor 170 on to lower the voltage on node 164 to $V_{EE}$. When the address signal $A_N$ is low, transistor 162 is conducting and transistor 166 is turned off. This will raise the voltage on node 164 to $V_{CC}$. Therefore, the translator of FIG. 8 provides a rail to rail voltage swing for the output voltage.

In summary, there has been provided a hybrid memory cell which utilizes a CMOS latch for storing two logic states. The memory cell is accessed by changing the word line voltage between two voltage levels to provide a read function. The memory cell is buffered through a bipolar transistor to provide a low source impedance current driver for output to a sense amp. A write function is provided by discharging one of the storage nodes to force the CMOS latch to a predetermined logic state in a response to receiving both a write select and an active word line voltage for a selected cell. This allows the cell to be written to with voltage swings compatible with ECL memories.

Although the preferred embodiment has been described in detail, it should be understood that various changes, substitutions and alterations can be made therein without departing from the spirit and scope of the invention as defined by the appended claims.

What is claimed is:

1. A high speed memory cell, comprising:
   a CMOS latch having two storage nodes, an upper voltage terminal and a lower voltage terminal, said two storage nodes for being disposed at opposite voltages representative of two stored logic states at either the voltage of said upper voltage terminal or said lower voltage terminal;
   a first supply voltage connected to said upper voltage terminal;
   a second supply voltage connected to said lower voltage terminal;
   output drive circuitry having a low source impedance for sensing the voltage and corresponding logic state on one of said two storage nodes and driving an external load to output the corresponding logic state in response to receiving a cell select signal generated external to the cell; and
   write circuitry operable in response to receiving an externally generated write enable signal, said cell select signal and write data to force one of said nodes to the voltage on said low voltage terminal when said write data is at one of two logic states and the other of said nodes to the voltage of said low voltage terminal when said write data is at the other of said two logic states.

2. The memory cell of claim 1 wherein said CMOS latch comprises a cross coupled CMOS latch having:
   a first P-channel transistor having a source to drain path connected between said upper voltage terminal and one of said two storage nodes and a gate thereof connected to the other of said storage nodes;
   a second P-channel transistor having a source to drain path connected between said upper voltage terminal and said other storage node and a gate thereof connected to said one storage node;
   a first N-channel transistor having a source to drain path connected between said one storage node and said lower voltage terminal and a gate thereof connected to the gate of said first P-channel transistor; and
   a second N-channel transistor having a source to drain path connected between said other storage node and said lower voltage terminal and a gate thereof connected to the gate of said second P-channel transistor.

3. The high speed memory cell of claim 1 wherein said output drive circuitry comprises a current driver operating in response to receiving said cell select signal for sourcing a current to said external load from a supply when the voltage on the sensed one of said storage nodes is at the voltage of said upper voltage terminal to define a first logic state, for not sourcing current to said external load when the voltage on the sensed one of said storage nodes is at the voltage on said lower voltage terminal, to define a second logic state and for inhibiting said driver from sourcing current in the absence of said cell select signal.

4. The high speed memory cell of claim 1 wherein said output drive circuitry comprises a bipolar transistor having an emitter-collector path connected between said upper voltage terminal and said external load and the base thereof connected to the sensed one of said two storage nodes, said bipolar transistor operable to source current with one emitter base junction thereof is forward biased, and said first supply voltage is operable to vary between two predetermined voltage levels, a first selecting voltage level and a second static voltage level, said bipolar transistor operable to source current from said upper voltage terminal when the voltage thereof is at said selecting voltage level and inoperative to source current when said upper voltage terminal is at said static voltage level.

5. The high speed memory cell of claim 1 wherein said write circuitry comprises:
   a first active switch disposed between one of said two storage nodes and said lower voltage terminal and having a control input, said first active switch operable to discharge said one storage node to said lower voltage terminal when the voltage difference of the voltage on said control input and said lower voltage terminal exceeds a predetermined threshold voltage;
   a second active switch disposed between the other of said two storage nodes and said lower voltage terminal and having a control input, said second active switch operable to discharge said other storage node to said lower voltage terminal when the voltage on said control input and the voltage on said lower voltage terminal exceed said predetermined threshold voltage;
   a first data line operable to connect one bit of said write data to the control input of said first active switch;
   a second data line operable to connect the inverted form of said one bit of write data to the control input of said second active switch;

the level of said write data varying between a first level and a second level greater than said first level by said predetermined threshold voltage; and write select control circuitry for varying the voltage of said second supply voltage between said first level and said second level with said second supply voltage being disposed at said second level in the presence of both said cell select signal and said write enable signal and at said first level in the absence of said write enable signal.

6. The high speed memory cell of claim 5 wherein said first and second active switches have a low source impedance.

7. The high speed memory cell of claim 5 wherein said first and second active switches are each comprised of bipolar transistors.

8. The memory cell of claim 1 wherein said write circuitry comprises a MOS transistor.

9. The memory cell of claim 8 wherein the MOS transistor having a conductive path coupled to said storage nodes and to a current sink and having a voltage controlled input for selectively discharging said storage nodes when voltage on said voltage controlled input is above a predetermined level.

10. A high speed memory cell, comprising:
a cell select terminal operable to be disposed at a cell select voltage for selecting the cell or a nonselect static voltage lower than said cell select voltage when the cell is not selected;
a reference voltage terminal disposed at a voltage lower than said nonselect voltage;
a cross coupled CMOS latch having:
first and second storage nodes,
a first P-channel transistor having a source to drain path connected between said cell select terminal and said first storage node and a gate connected to said second storage node,
a second P-channel transistor having a source to drain path connected between said cell select terminal and said second storage node and a gate connected to said first storage node,
a first N-channel transistor having a source to drain path connected between said first storage node and said reference terminal and having a gate connected to said second storage node, and
a second N-channel transistor having a source to drain path connected between said second storage node and said reference terminal and a gate connected to said first storage node;
a low impedance current driver having a first control input connected to said first storage node and operable to source current from said cell select terminal when the voltage on the control input is above a first predetermined threshold, said first predetermined threshold being less than said select voltage level and greater than said nonselect voltage, wherein said driver conducts current when said cell select terminal is at said cell voltage level and said first P-channel transistor is conducting;
switching means having a conductive path coupled to said storage nodes and to a current sink and having a voltage controlled input for selectively discharging said storage nodes when voltage on said voltage controlled input is above a predetermined threshold; and
write select circuitry for inhibiting said switching means from discharging said first and second storage nodes when said cell select terminal is at a nonselect voltage and a write enable signal is not present.

11. The high speed memory cell of claim 10 wherein said switching means comprises a MOS transistor.

12. The high speed memory cell of claim 10 wherein said switching means comprises:
a first active switch having a conducting path connected between said first storage node and said current sink and having a second control input for selectively discharging said first storage node when the voltage on the control input thereof is above second predetermined threshold;
a second active switch having a conducting path disposed between said second storage node and said current sink and having a third control input for selectively discharging said second storage node when the voltage on the control input thereof is above said second predetermined threshold; and
the control inputs of said first and second active switches connected to the inverted and noninverted forms of a two state logic signal having a first logic state level lower than said second predetermined threshold and a second logic state level higher than said second predetermined threshold; and 13. The high speed memory cell of claim 12 wherein said low impedance driver comprises a bipolar transistor having an emitter collector path connected between said cell select terminal and the external load and the base thereof connected to said first storage node.

14. The high speed memory cell of claim 12 wherein said current sink is said reference voltage terminal.

15. The high speed memory cell of claim 12 wherein said first and second active switches have a low source impedance.

16. The high speed memory cell of claim 12 wherein said first and second active switches each comprise a bipolar transistor wherein and said second predetermined threshold is a voltage drop across a forward biased emitter-base diode junction of said bipolar transistors.

17. The high speed memory cell of claim 12 wherein said current sink is said reference voltage terminal and said reference voltage terminal is operable to be disposed at a first voltage less than the second level of said write data by at least said second predetermined threshold voltage and at a second level greater than said first level wherein said write select. circuitry comprises logic circuitry connected to said cell select terminal and to said write enable signal to output said first and second levels to said cell select terminal and to said write enable signal to output said first and second levels to said reference voltage terminal, said first level output when said cell select terminal is at the cell select level and said write enable signal is present, and at said second level output in the absence of said write enable signal.

18. A high speed memory cell, comprising:
a cell select terminal operable to be disposed at a cell select voltage level for selecting the cell and at a lower nonselect voltage level when the cell is not selected;
a write select terminal for being diposed at a write select level lower than the nonselect level and a nonwrite select level lower than said write select level;
a cross coupled CMOS latch having:
first and second storage nodes;

a first P-channel transistor having a source to drain path connected between said cell select terminal and said first storage node and a gate connected to said second storage node, a second P-channel transistor having a source to drain path connected between said cell select terminal and second storage node and a gate connected to said first node, a first N-channel transistor having a source to path connected between said first storage node and said write select terminal and a gate connected to said second storage node, and a second N-channel transistor having a source to drain path connected between said second storage node and said write select terminal and a gate connected to said first storage node;

a bipolar transistor having an emitter-collector path connected between said cell select terminal and an external load and a base connected to said first storage node, said bipolar transistor operable to source current to said external load from said cell select terminal when the voltage on said first storage node exceeds said nonselect level;

a first bipolar write transistor having an emitter collector path connected between said first storage node and said write select terminal and having a base connected to a noninverted write signal;

a second bipolar write transistor having an emitter collector path connected between said second storage node and said write select terminal and a base connected to an inverted write data signal; and said first and second write transistors operable to discharge said first or second storage nodes, respectively, to said write select terminal when the voltage on the base thereof exceeds the emitter base forward bias voltage;

said noninverted write data and said inverted write data operable to vary between a first level equal to said nonwrite select level and a second level equal to said write select level.

19. A method for storing and accessing information at high speed comprising:

providing a CMOS latch having two storage nodes, an upper voltage terminal and lower voltage terminal with the two storage nodes bing disposed at opposite voltages representative of two stored logic states at either the voltage of the upper storage terminal or the voltage of the lower voltage terminal;

accessing the stored information by sensing the voltage on one of the two storage nodes and driving through a low impedance an external load to output the sensed voltage in response to receiving an externally generated cell select signal; and storing information on one of two storage nodes in response to receiving an externally generated write enable signal, cell select signal and write data by forcing one of the nodes to the voltage on the low voltage terminal when the write data is at one of the two logic states and the other of the two storage nodes to the voltage of the low voltage terminal when the write data is at the other of the two logic states.

20. A high speed memory cell, comprising:

a cell select terminal operable to be disposed at a cell select voltage level for selecting the cell and at a lower nonselect voltage level when the cell is not selected;

a write select terminal for being disposed at a write select level lower than the nonselect level and a nonwrite select level lower than said write select level;

a cross coupled CMOS latch having:

first and second storage nodes;

a first P-channel transistor having a source to drain path connected between said cell select terminal and said first storage node and a gate connected to said second storage node, a second P-channel transistor having a source to drain path connected between said cell select terminal and said second storage node and a gate connected to said first storage node, a first N-channel transistor having a source to drain path connected between said first storage node and said write select terminal and a gate connected to said second storage node; and a second N-channel transistor having a source to drain path connected between said second storage node and said write select terminal and a gate connected to said first storage node;

a bipolar transistor having an emitter-collector path connected between said cell select terminal and an external load and a base connected to said first storage node, said bipolar transistor operable to source current to said external load from said cell select terminal when the voltage on said first storage node exceeds said nonselect level;

a MOS write transistor coupled to said first or second storage node, said MOS write transistor operable to discharge said first or second storage node.

21. A hybrid semiconductor memory, comprising:

an array of memory cells arranged in rows and columns, each of said memory cells comprising an MOS latch for storing first and second voltage levels as first and second logic states, respectively;

a plurality of row lines each associated with a row of said memory cells;

a plurality of column read lines each associated with a column of said memory cells;

a plurality of column write lines each associated with a column of memory cells;

address circuitry for receiving and decoding row and column addresses and generating a row select signal for a select row and a column select signal for a select column;

row select circuitry for generating a row select voltage at a first predetermined voltage on said row line for the select one of the rows of said memory cells in response to generation of said row select signal, the remainder of said row lines associated with nonselected cells disposed at a second predetermined voltage;

read circuitry associated with each cell for sensing the stored voltage of the associated cell in response to said associated row line being at said row select voltage, and driving the associated one of said column line with a low source impedance to output a signal to said associated column line representative of said stored logic state;

said read circuitry interfaced with each of said column lines for sensing the representative logic state in read response to generation of said column select signal for the associated cell;

data circuitry for receiving external data and interfacing the received data to the column write line of the selected column of cells in response to generation of the column select signal and in response to receiving an external Write Enable signal; and driving circuitry associated with each cell for forcing a logic state in the one of said cells associated with said selected row and column to a voltage corresponding to the logic state of the received data on said selected column.

22. The memory of claim 21 wherein said MOS latch comprises a cross-coupled CMOS latch having first and second storage nodes disposed at opposite voltage at either said first or second voltage with one of said first or second voltages interfaced with said read circuitry.

23. The semiconductor memory of claim 21 wherein said read circuitry comprises a current sense amp circuit and further comprises a current switch that is activated when the voltage of said row line is at said row select voltage, said current switch operable ot switch current from said row line to said current sense amp circuit when the stored voltage is at a predetermined one of said first or second voltages and block current when at the other of said first or second voltages.

24. The semiconductor memory of claim 23 wherein the highest of said first and second voltages in said MOS latch is equal to the voltage on said row line and said current switch comprises a bipolar transistor having the emitter collector path connected between said row line and said sense amp through the associated column line such that current is conducted from said row line to the associated one of said column lines through said bipolar transistor when the stored voltage is at said row select voltage.

25. The semiconductor memory of claim 21 wherein said first and second predetermined voltages associated with said row select circuitry are ECL compatible voltages.

26. The semiconductor memory of claim 21 wherein said address circuitry, said read circuitry, said data circuitry and said driving circuitry are ECL compatible.

27. The semiconductor memory of claim 21 wherein said data circuitry comprises ECL data circuitry associated with each cell for switching current through said associated column line to a current source in response to selection of said associated cell in response to the presence of said Write Enable signal, the current representative of the logic state of said data, and said driving circuitry comprises a bipolar transistor with a low source impedance for driving the voltage stored in said MOS latch to a predetermined one of such first and second voltage levels corresponding the logic state of said data represented by the current through said column line.

* * * * *